United States Patent
Latham et al.

(10) Patent No.: US 10,156,614 B2
(45) Date of Patent: Dec. 18, 2018

(54) SYSTEMS AND METHODS FOR SENSING A VOLTAGE TRANSIENT IN A MAGNETIC FIELD SENSOR INTEGRATED CIRCUIT

(71) Applicant: Allegro MicroSystems, LLC, Manchester, NH (US)

(72) Inventors: Alexander Latham, Harvard, MA (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 159 days.

(21) Appl. No.: 15/363,208

(22) Filed: Nov. 29, 2016

(65) Prior Publication Data

US 2018/0149713 A1 May 31, 2018

(51) Int. Cl.
  *G01R 33/07* (2006.01)
  *G01R 33/00* (2006.01)
  *H01L 27/22* (2006.01)
  *H01L 43/06* (2006.01)
  *H01L 43/08* (2006.01)
  *G01R 33/09* (2006.01)
  *G01R 19/00* (2006.01)
  *G01R 15/20* (2006.01)

(52) U.S. Cl.
  CPC ....... *G01R 33/0076* (2013.01); *G01R 15/202* (2013.01); *G01R 15/205* (2013.01); *G01R 19/0092* (2013.01); *G01R 33/0023* (2013.01); *G01R 33/0047* (2013.01); *G01R 33/07* (2013.01); *G01R 33/09* (2013.01); *H01L 27/22* (2013.01); *H01L 43/065* (2013.01); *H01L 43/08* (2013.01)

(58) Field of Classification Search
CPC .... G01R 15/202; G01R 15/205; G01R 33/07; G01R 33/09; G01R 33/0023; G01R 33/0047; G01R 33/0076; H01L 43/08; H01L 43/065; H01L 27/22
See application file for complete search history.

(56) References Cited

U.S. PATENT DOCUMENTS

| | | | |
|---|---|---|---|
| 6,812,687 B1 * | 11/2004 | Ohtsuka | H01L 43/065 257/E43.003 |
| 7,598,601 B2 | 10/2009 | Taylor et al. | |
| 8,080,994 B2 | 12/2011 | Taylor et al. | |
| 9,176,170 B2 * | 11/2015 | Racz | G01R 15/202 |

(Continued)

*Primary Examiner* — Minh N Tang
(74) *Attorney, Agent, or Firm* — Daly, Crowley, Mofford & Durkee, LLP

(57) ABSTRACT

The concepts, systems, circuits and techniques described herein are directed toward sensing a voltage transient within a magnetic field sensor integrated circuit, such as a current sensor. A magnetic field sensor integrated circuit includes a substrate having a first surface and a second opposing surface, at least one magnetic field sensing element supported by a first surface of the substrate, an electromagnetic shield layer disposed on a shielded region of the first surface of the substrate adjacent to an unshielded region of the first surface of the substrate and an electrode disposed in the unshielded region of the first surface of the substrate and configured to permit detection of the voltage transient. In some embodiments, the shielded region and/or the electrode can be omitted.

38 Claims, 11 Drawing Sheets

(56) References Cited

U.S. PATENT DOCUMENTS

| | | | |
|---|---|---|---|
| 2004/0135220 A1* | 7/2004 | Goto | H01L 27/22 257/427 |
| 2006/0219436 A1 | 10/2006 | Taylor et al. | |
| 2007/0279053 A1 | 12/2007 | Taylor et al. | |
| 2008/0297138 A1* | 12/2008 | Taylor | H01L 24/37 324/117 H |

* cited by examiner

SYSTEMS AND METHODS FOR SENSING A VOLTAGE TRANSIENT IN A MAGNETIC FIELD SENSOR INTEGRATED CIRCUIT

FIELD OF THE INVENTION

The concepts, systems, circuits and techniques described herein relate generally to magnetic field sensor integrated circuit and more particularly, to techniques for sensing a voltage transient in a magnetic field sensor integrated circuit.

BACKGROUND

As is known in the art, some magnetic field sensor integrated circuits use a magnetic field sensing element in proximity to a current conductor. The sensing element can generate an output signal having a magnitude proportional to the magnetic field induced by a current that flows through the current conductor.

However, an unwanted voltage transient within the magnetic field sensor integrated circuit can adversely impact the performance and output of the sensing element and the current sensor causing an unwanted or inaccurate response. For example, capacitive coupling between the substrate/die and the current conductor can result in unwanted noise within the sensor when fast voltage transients occur on the current conductor. In some sensors, a metal "shield" layer can be positioned between the current conductor and the substrate supporting the sensing element. However, such a shield layer may have slits, slots, or holes near the sensing element in order to reduce the formation of eddy currents and such features can permit some noise from fast transients to propagate within the sensor.

SUMMARY

The concepts, systems, circuits and techniques described herein are directed toward techniques for sensing an unwanted voltage transient within a magnetic field sensor integrated circuit, such as a current sensor. The voltage transient may cause the sensor to output an erroneous signal. Therefore, a sensor may be provided having a sensing electrode positioned on a surface of a substrate of the sensor to permit detection of a rate of change of voltage within the sensor. The sensing electrode or circuit node may be used to sense and determine when the unwanted voltage transient (dV/dt) occurs within the current sensor and during which sampling cycle. Thus, when the rate of change of the voltage is greater than a predetermined threshold, the output of the current sensor can be configured to ignore the corresponding samples and output a previous sample or another valid sample (i.e., not corrupted sample) as the output of the current sensor.

In an embodiment, the sensing electrode can be integrated with a magnetic field sensing element and electronics in one embodiment. The sensing electrode can be coupled to, disposed on or otherwise formed within a current sensor or magnetic field sensor integrated circuit (IC) to detect the voltage transient. In some embodiments, the current sensor or magnetic field sensor IC may have an electromagnetic shield in the area of the magnetic field sensing element and integrated electronics, but not in the area of the sensing electrode. Thus, the sensing electrode can be exposed to permit detection of the rate of change of the voltage.

In one aspect, a magnetic field sensor integrated circuit includes a substrate having a first surface and a second opposing surface, at least one magnetic field sensing element supported by the first surface of the substrate, an electromagnetic shield layer disposed on a shielded region of the first surface of the substrate adjacent to an unshielded region of the first surface of the substrate and an electrode disposed in the unshielded region of the first surface of the substrate and configured to permit detection of a voltage transient. In an embodiment, a bond pad is coupled to the electrode.

In an embodiment, the electromagnetic shield layer may include at least one feature configured to reduce an eddy current in the electromagnetic shield layer.

The at least one magnetic field sensing element may include a Hall Effect element or a magnetoresistance element. In some embodiments, the magnetoresistance element may include one or more of a giant magnetoresistance (GMR) element, a linear spin-valve, a magnetic tunnel junction (MTJ) element, a tunneling magnetoresistance (TMR) element, or an anisotropic magnetoresistance (AMR) element.

In some embodiments, the magnetic field sensor IC may include a threshold detection circuit configured to detect whether a rate of change of a voltage across a capacitance between a current conductor portion of the magnetic field sensor integrated circuit and the electrode is greater than a predetermined level. The threshold detection circuit may include at least one comparator having a first input coupled to the electrode, a second input responsive to a reference voltage, and an output at which a comparator output signal is provided at a first level when the rate of change of the voltage across the capacitance is greater than the predetermined level and at a second level when the rate of change of the voltage across the capacitance is less than the predetermined level. The comparator output signal may be provided as an output of the magnetic field sensor integrated circuit.

In another aspect, a current sensor includes a lead frame comprising a plurality of leads, a current conductor portion comprising at least two of the plurality of leads, a substrate having first and second opposing surfaces, the first surface proximate to the current conductor portion and the second surface distal from the current conductor portion, one or more magnetic field sensing elements supported by the first surface of the substrate and at least one electrode supported by the first surface of the substrate.

In an embodiment, an electromagnetic shield may be disposed on a shielded region of the first surface of the substrate adjacent to an unshielded region of the first surface of the substrate. The one or more magnetic field sensing elements can be disposed in the shielded region of the first surface of the substrate and the at least one electrode can be disposed in the unshielded region of the first surface of the substrate. In some embodiments, the electromagnetic shield has at least one feature configured to reduce an eddy current in the electromagnetic shield.

In an embodiment, the at least one magnetic field sensing element may include a Hall Effect element or a magnetoresistance element. The magnetoresistance element may include one or more of a giant magnetoresistance (GMR) element, a linear spin-valve, a magnetic tunnel junction (MTJ) element, a tunneling magnetoresistance (TMR) element, or an anisotropic magnetoresistance (AMR) element.

The current sensor may include a threshold detection circuit configured to detect whether a rate of change of a voltage across a capacitance between the current conductor portion and the electrode is greater than a predetermined level. The threshold circuit may include at least one comparator having a first input coupled to the at least one electrode, a second input responsive to a reference voltage, and an output at which a comparator output signal is provided at a first level when the rate of change of the voltage across the capacitance is greater than the predetermined level and at a second level when the rate of change of the voltage across the capacitance is less than the predetermined level. In some embodiments, the comparator output signal can be provided as an output of the current sensor.

In another aspect, a method for sensing a voltage transient in a magnetic field sensor integrated circuit includes providing a substrate having a surface supporting a magnetic field sensing element configured to generate a magnetic field signal and supporting an electrode, generating a sensor output signal associated with the magnetic field signal, shielding only a portion of the surface of the substrate to expose the electrode, detecting a rate of change of voltage across a capacitance between a current conductor adjacent to the surface of the substrate and the electrode and determining whether the detected rate of change of the voltage is greater than a predetermined level and generating a comparison signal indicative of the determination.

In an embodiment, the magnetic field may correspond to a magnetic field generated by the current conductor. The magnetic field signal may be provided as the sensor output signal of the magnetic field sensor integrated circuit.

In some embodiments, an absolute value of the detected rate of change of the voltage may be compared to the predetermined level to generate the appropriate comparison signal. For example, the comparison signal may be provided at a first level when the rate of change of the voltage across the capacitance is greater than the predetermined level or at a second, opposite level when the rate of change of the voltage across the capacitance is less than the predetermined level.

The method may further includes storing a previous sample of the magnetic field signal. The previous sample of the magnetic field signal may be provided as the sensor output signal of the magnetic field sensor when the comparison signal is at the first level. The previous sample of the magnetic field signal may be updated when the comparison signal is at the second level and held when the comparison signal is at the first level.

In some embodiments, the method further includes storing an odd number of at least three previous samples of the magnetic field signal and further comprising computing a median value of the stored previous samples of the magnetic field signal. The median value of the stored previous samples of the magnetic field signal can be provided as the sensor output signal when the comparison signal is at the first level.

In an embodiment, the method further includes storing a difference between a current sample of the magnetic field signal and the previous sample of the magnetic field signal, comparing the difference to a threshold value to generate a difference signal, and providing the current sample of the magnetic field signal as the sensor output signal when the difference signal is at a first level and providing the previous sample of the magnetic field signal as the sensor output signal of the magnetic field sensor when the difference signal is at a second level. In some embodiments, an absolute value of the difference may be compared to the threshold value to generate the difference signal. If the absolute value of the difference is greater than the threshold value and thus at the second level, this may indicate a disturbance (e.g., voltage transient) occurred within the magnetic field sensor integrated circuit.

In some embodiments, a rate of change of a second voltage across a second capacitance may be detected between the current conductor and a lead of a lead frame electrically coupled to the substrate.

In another aspect, a method for sensing a voltage transient in a magnetic field sensor integrated circuit includes providing a substrate having a surface supporting a magnetic field sensing element configured to generate a magnetic field signal, generating a sensor output signal associated with the magnetic field signal, detecting a rate of change of voltage across a capacitance between a current conductor adjacent to the surface of the substrate and at least one lead of a lead frame electrically coupled to the substrate, and determining whether the detected rate of change of the voltage is greater than a predetermined level and generating a comparison signal indicative of the determination.

In some embodiments, the method further includes shielding only a portion of the surface of the substrate. The magnetic field signal may be provided as the sensor output signal of the magnetic field sensor integrated circuit.

In an embodiment, a previous sample of the magnetic field signal may be stored. In some embodiments, generating the comparison signal comprises providing the comparison signal at a first level when the rate of change of the voltage across the capacitance is greater than the predetermined level or at a second, opposite level when the rate of change of the voltage across the capacitance is less than the predetermined level. The previous sample of the magnetic field signal may be provided as the sensor output signal when the comparison signal is at the first level.

In some embodiments, the method further comprises updating the previous sample of the magnetic field signal when the comparison signal is at the second level and holding the previous sample of the magnetic field signal when the comparison signal is at the first level. In an embodiment, storing a previous sample of the magnetic field signal comprises storing an odd number of at least three previous samples of the magnetic field signal and further comprises computing a median value of the stored previous samples of the magnetic field signal. The median value of the stored previous samples of the magnetic field signal may be provided as the sensor output signal when the comparison signal is at the first level.

In some embodiments, the method further comprises storing a difference between a current sample of the magnetic field signal and the previous sample of the magnetic field signal, comparing the difference to a threshold value to generate a difference signal, and providing the current sample of the magnetic field signal as the sensor output signal when the difference signal is at a first level and providing the previous sample of the magnetic field signal as the sensor output signal of the magnetic field sensor when the difference signal is at a second level.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
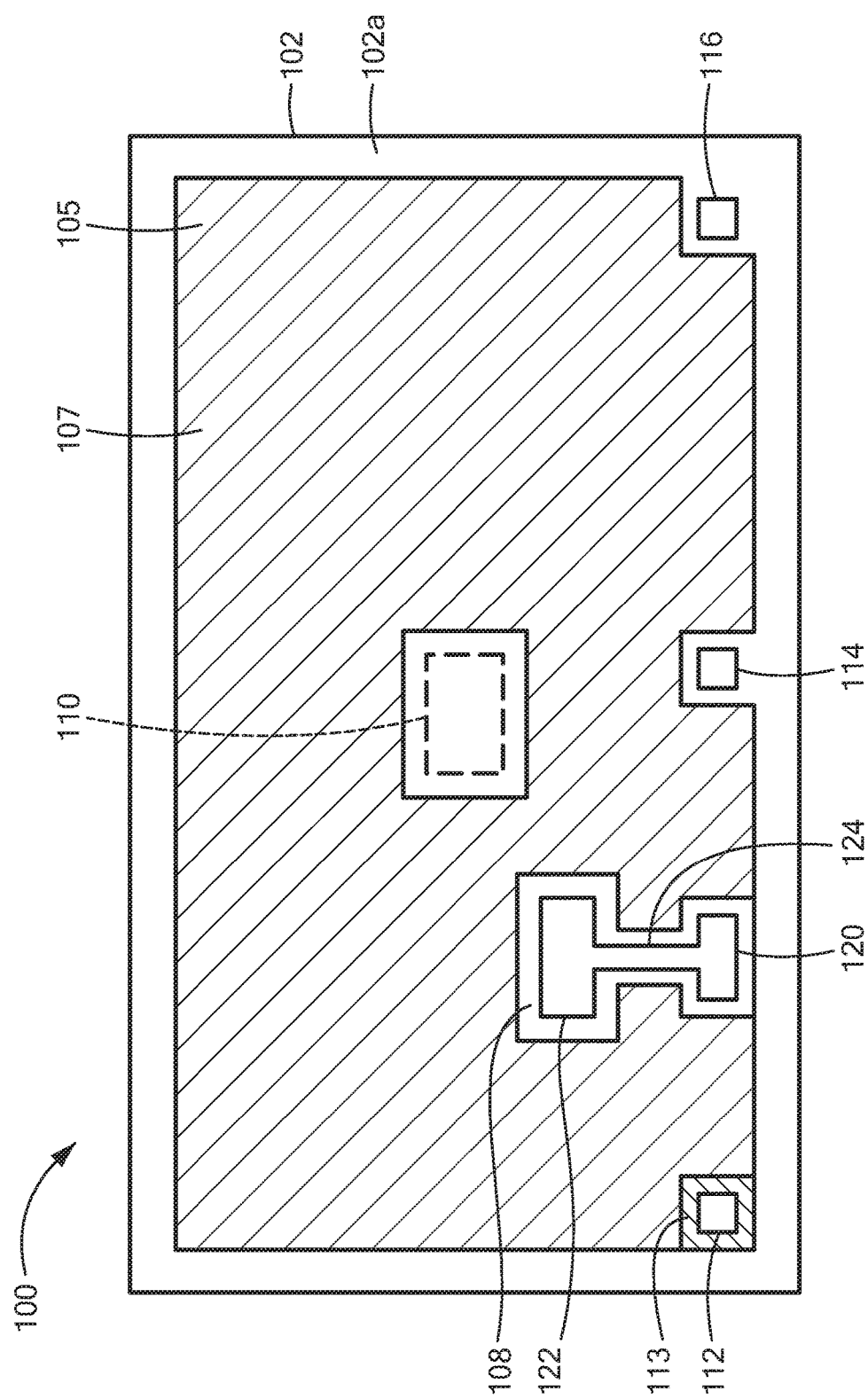
FIG. 1 is a plan view of a magnetic field sensor integrated circuit having a sensing element in a shielded portion and a sensing electrode in an unshielded portion.

Now referring to FIG. 1, magnetic field sensor integrated circuit (IC) 100 is provided having an electrode 122 to permit detection of a voltage transient. The magnetic field sensor IC 100 includes a substrate 102, a magnetic field sensing element 110 supported by the substrate 102, an electromagnetic shield 105 on a first surface 102a of the substrate 102 and electrode 122 (e.g., voltage sensing element, sensing electrode). In an embodiment, substrate 102 may be a semiconductor substrate and include silicon or include an insulating substrate. In some embodiments, the first surface 102a may include a shielded region 107 and an unshielded region 108. In an embodiment, the shielded region 107 may be formed such that it is adjacent to the unshielded region 108. The electromagnetic shield 105 may be disposed in, and form the shielded region 107 and the electrode 122 may be disposed in the unshielded region 108.

In an embodiment, the magnetic field sensor IC 100 may include one or more bond pads 112, 114, 116, 120. Bond pads 112, 114, 116, 120 may be formed or otherwise disposed on various portions of substrate 102. For example, and as illustrated in FIG. 1, bond pads 112, 114, 116, 120 may be disposed along an edge or side of first surface 102a. In some embodiments, bond pads 112, 114, 116, 120 may include microbumps. In an embodiment, and as will be illustrated in FIGS. 2-2A, bond pads 112, 114, 116, 120 may be used to couple various surfaces and/or elements together. For example, in one embodiment, bond pads 112, 114, 116, 120 may be used to couple magnetic field sensing element 110 and the other electronics supported by substrate 102 to signal leads of a lead frame.

In some embodiments, at least one bond pad 120 may be coupled to the sensing electrode 122. For example, and as illustrated in FIG. 1, bond pad 120 can be coupled to electrode 122 through a conductive element 124. Conductive element 124 may include aluminum, copper or other conductive material. Although FIG. 1 illustrates the conductive element 124 in the unshielded region 108, it should be appreciated that in some embodiments, conductive element 124 may be disposed in shielded region 107. In some embodiments, one or more of bond pads 112, 114, 116, 120 may be disposed in shielded region 107.

In an embodiment, electromagnetic shield 105 may include at least one feature configured to reduce an eddy current in the shielded region 107. For example, electromagnetic shield 105 may include an aperture, hole or opening (e.g., slot, slit, cut, cross shape opening) to limit the amount of eddy currents forming in the shielded region 107.

In an embodiment, electrode 122 may be disposed in the unshielded region 108 of first surface 102a to permit detection of a voltage transient. For example, electrode 122 may be positioned on first surface 102a such that it is exposed to a current within magnetic field sensor IC 100. In some embodiments, electrode 122 may be positioned on first surface 102a in location where a voltage transient may occur.

The magnetic field sensor integrated circuit 100 may be a current sensor or other type of magnetic field sensor susceptible to voltage transients of which detection is desirable.

Figure 1A:
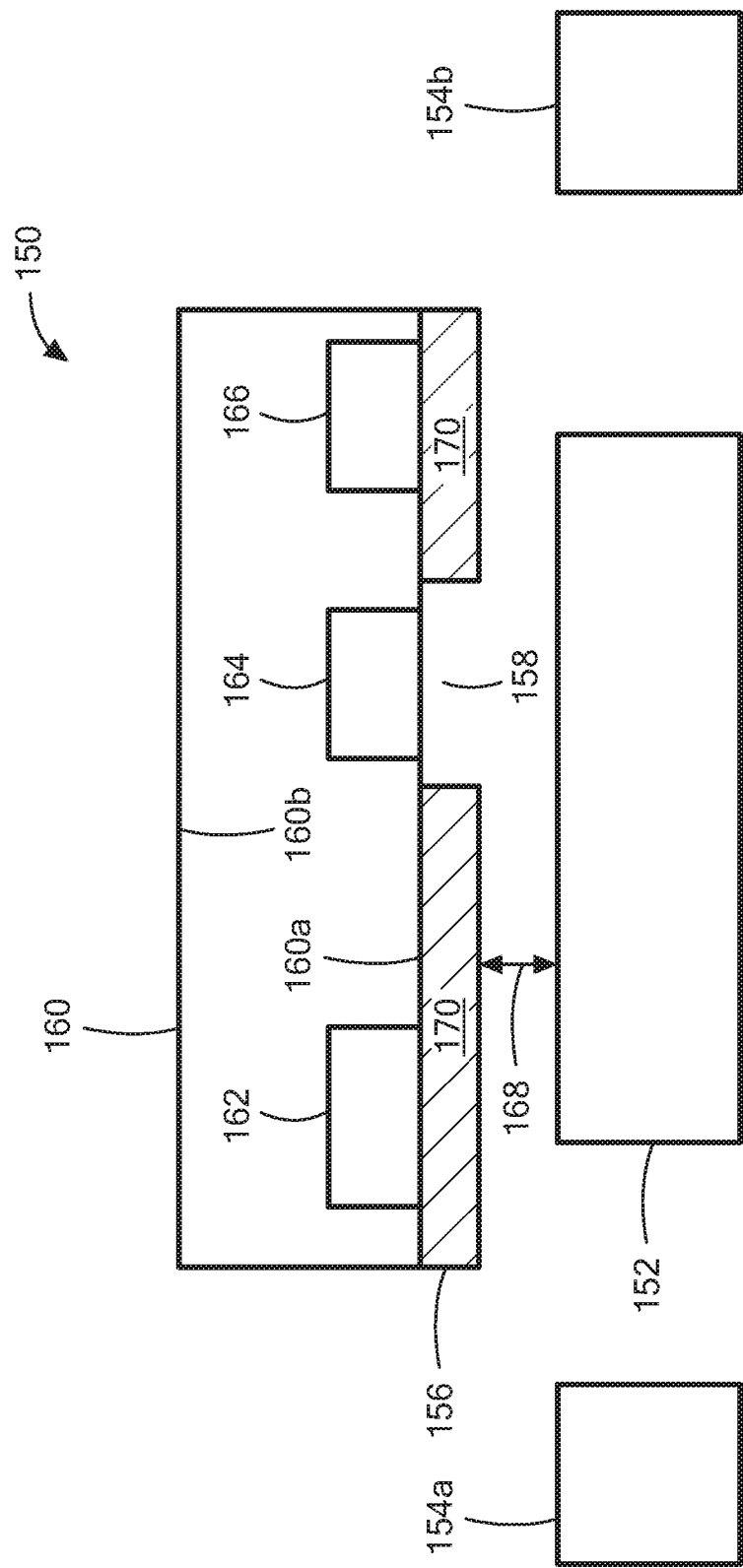
FIG. 1A is a cross-sectional view of a current sensor with a shield layer and a sensing electrode.

Now referring to FIG. 1A, a current sensor 150 is provided with an electrode 164 to permit detection (e.g., sense) of a voltage transient. The current sensor 150 includes a conductor 152 and a substrate 160 having a first surface 160a proximate to the conductor 152 and a second surface 160b. The current sensor 150 further includes an electromagnetic shield layer 170 forming a shielded region 156 of the first surface 160a, a magnetic sensing circuit, including magnetic field sensing element 162, supported by the first surface 160a and the electrode 164 disposed in an unshielded region 158 of the first surface 160a.

In an embodiment, shielded region 156 may refer to a region or portion of the first surface 160a covered by the electromagnetic shield 170 and unshielded region 158 may refer to a region or portion of the first surface 160a not covered by the electromagnetic shield 170. The electromagnetic shield 170 may be applied to, deposited on or otherwise formed over portions of first surface 160a. Electromagnetic shield 170 may include at least one of copper or aluminum. In an embodiment, the shield layer 170 can be disposed in various arrangements between substrate 160 and conductor 152 to shunt electrical, voltage or electrical noise to ground or prevent coupling electrical, voltage or electrical noise onto substrate 160 during high transient (dV/dt) events in the current carrying conductor 152.

The electromagnetic shield 170 may include at least one feature configured to reduce an eddy current in electromagnetic shield layer 170. For example, in some embodiments, to limit the amount of eddy currents forming in the electromagnetic shield layer 170, the electromagnetic shield layer 170 may include an aperture, hole or opening (e.g., a slot, slit, cut, cross shape opening). The aperture, hole or opening may be in addition to unshielded region 158.

In an embodiment, current sensor 150 may include a threshold circuit 166, as may be supported by the first surface 160a. The threshold circuit 166 may be configured to detect whether a rate of change of a voltage across a capacitance between the conductor 152 and the electrode 164 is greater than a predetermined threshold. In some embodiments, the threshold circuit may be disposed in the shielded region 156 of the first surface 160a. In other embodiments, the threshold circuit 166 may be disposed in or aligned with the unshielded region 158. In some embodiments, threshold circuit 166 may be disposed, supported by or otherwise formed on the second surface 160b of substrate 160. The threshold circuit 166 will be described in greater detail below with respect to FIGS. 3-4F.

In an embodiment, current sensor 150 may include a plurality of leads 154a, 154b. For example, current sensor 150 may be provided as an integrated circuit (IC) having a lead frame. The lead frame may have two portions; a first portion for carrying a primary current to be detected and a second portion for carrying signals to and from the current sensor. In some embodiments, the first portion of the lead frame may provide the conductor 152 and the second portion of the lead frame may comprise the plurality of signal leads 154a, 154b.

In an embodiment, the lead frame may be formed from various materials and by various techniques, such as stamping or etching. As one example, the lead frame may be a copper lead frame pre-plated with NiPdAu. Other suitable materials for the lead frame include but are not limited to aluminum, copper, copper alloys, titanium, tungsten, chromium, Kovar™, nickel, or alloys of the metals. Furthermore, the lead frame may be comprised of a non-conductive substrate material, such as a standard PC board with FR-4 and copper traces, or a Kapton material with copper or other metal traces (for example a flexible circuit board). The lead and lead frame dimensions can be readily varied to suit particular application requirements.

In an embodiment, magnetic field sensing element 162 may include one or more Hall effect elements or magnetoresistance elements. For example, the magnetoresistance elements may include one or more of a giant magnetoresistance (GMR) element, a linear spin-valve, a magnetic tunnel junction (MTJ) element, a tunneling magnetoresistance (TMR) element, or an anisotropic magnetoresistance (AMR) element.

In some embodiments, magnetic field sensing element 162 may be diffused into first surface 160a or otherwise disposed on or supported by the first surface 160a. While only one magnetic field sensing element 162 is shown, it should be appreciated that more than one magnetic field sensing element 162 may be used in current sensor 150 or any current sensor or magnetic field sensing IC described herein.

In an embodiment, electrode 164 may be configured to detect when a voltage transient occurs within current sensor 150. Electrode 164 may be diffused into first surface 160a or otherwise disposed or deposited on or supported by the first surface 160a. In some embodiments, a position of electrode 164 on first surface 160a can be selected based upon an expected location of a voltage transient may occur within current sensor 150. It should be appreciated however, that electrode 164 can be positioned in a variety of different locations within or on surfaces of current sensor 150 and the position can be selected based upon a particular application of current sensor 150. Electrode 164 can be coupled to threshold circuit 166 to provide an indication of the voltage transient. In an embodiment, the indication may be a voltage value provided to threshold circuit 166.

Figure 2:
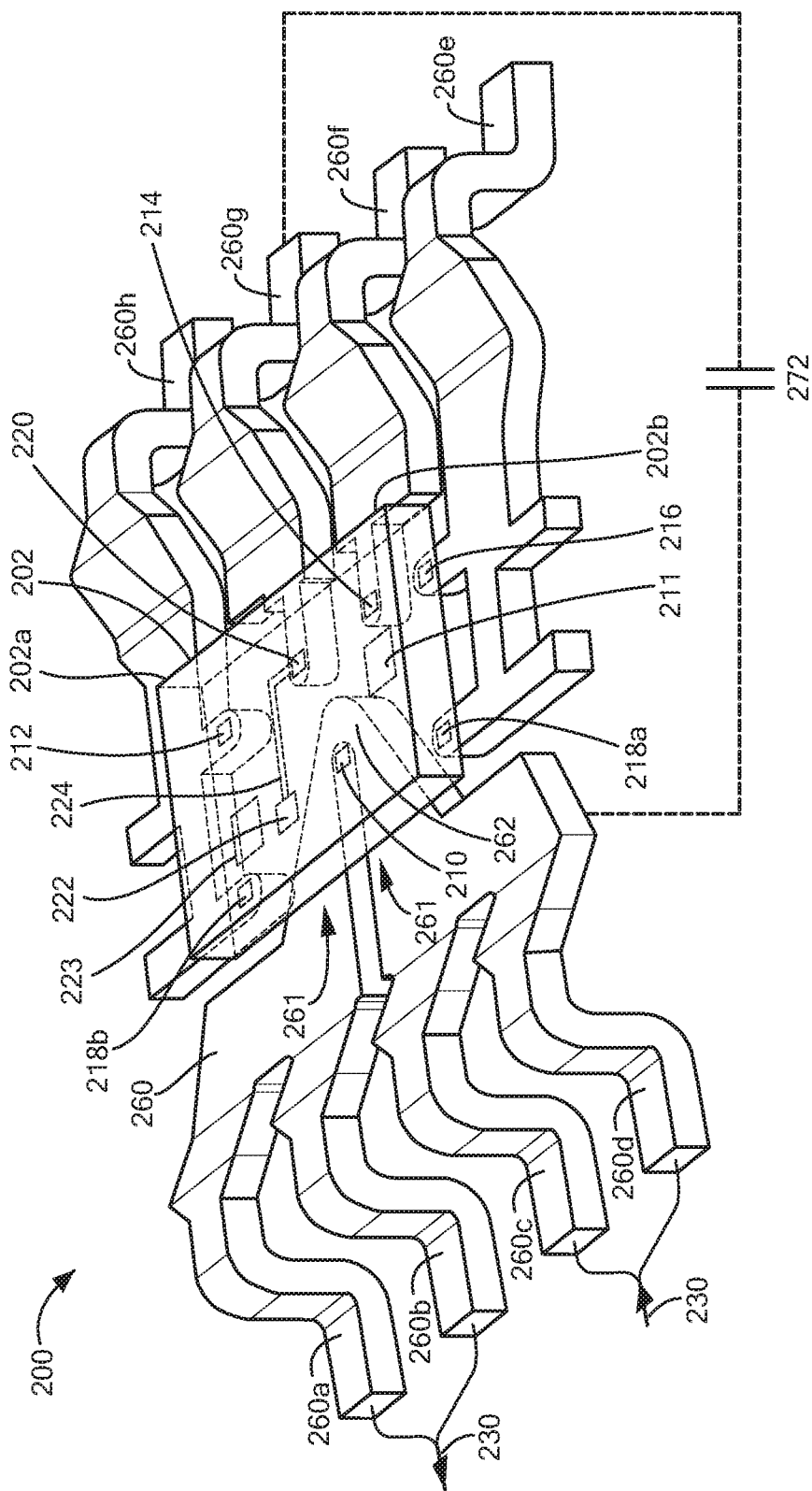
FIG. 2 is an isometric view of a current sensor having a sensing element and a sensing electrode coupled to a lead frame.

Now referring to FIG. 2, a current sensor 200 is provided as an integrated circuit (IC) having a lead frame 260. The lead frame 260 may have two portions, a first portion for carrying a primary current to be detected and a second portion for carrying signals to and from the current sensor. For example, the first portion of the lead frame 260 may provide a current conductor portion 260 and the second portion of the lead frame may comprise a plurality of signal leads 260e-260h. The current conductor portion 260 may include at least two of the plurality of leads 260a-260d. In an embodiment, the current sensor 200 may include a substrate 202 coupled to or mounted on the lead frame 260.

The current sensor 200 further includes a substrate 202 having a first surface 202a proximate to the conductor 261 and a second opposing surface 202b, one or more magnetic field sensing elements 210 supported by the first surface 202a, first and second circuitry 211, 223 and at least one electrode 222 supported by the first surface 202a. In the illustrative embodiment of FIG. 2, substrate 202 (die, chip)

is shown in a flip-chip arrangement to the lead frame 260 with the active surface of the substrate adjacent to the conductor 261.

Circuitry 211, 223 may include electronic components, for example, transistors, resistors, and capacitors that form an electrical circuit to process the signals from the magnetic field sensing element 210 and/or electrode 222. For example, in an embodiment, circuitry 211, 223 may include a threshold circuit supported by the first surface 202a (e.g., threshold circuit 166 of FIG. 1A). The threshold circuit may be configured to detect whether a rate of change of a voltage across a capacitance between the conductor 261 and the electrode 222 is greater than a predetermined threshold. In some embodiments, threshold circuit may be disposed, supported by or otherwise formed on the second surface 202b of substrate 202. Circuitry 211, 223 may be coupled (e.g., wired, electrically coupled) to magnetic field sensing element 210 and/or electrode 222. The threshold circuit will be described in greater detail below with respect to FIGS. 3-4F.

Current sensor 200 may include a plurality of bond pads 212, 214, 216, 218a-218b, 220. In an embodiment, at least one bond pad 212, 214, 216, 218a-218b, 220 may be coupled to at least one of the plurality of leads 260a-260h. For example, in one embodiment, the bond pads 212, 214, 216, 218a-218b, 220 may be coupled to the plurality of leads 260a-260h using solder. Electrode 222 may be coupled to the bond pad 220 through a conductive element 224 (e.g., like conductive element 124 of FIG. 1).

In some embodiments, a first set of bond pads 212, 214, 216, and 220 may be connected to a first set of leads 260e-260h through a wire bond, stud bump, pillar bump, conductive epoxy or other electrically conductive means. For example, these embodiments may use packaging techniques referred to as lead on chip, chip on lead, or chip and wire. The die may be facing toward or away from the lead frame 260 in different embodiments.

In some embodiments, bond pads 218a, 218b may be used for an electrical connection, or they may simply be used as mechanical standoffs. For example, in the case of mechanical standoffs, the bond pads 218a, 218b may have only a pad area that is not connected to circuitry supported by the substrate 202 and may be insulated to achieve a desired breakdown voltage requirement. In other embodiments, the pad areas 218a, 218b are disposed on or otherwise provided on top of an insulating dielectric such as a polyimide, benzocyclobutene (BCB), or other polymer layer.

The voltage sensing element 222 can be positioned where an expected transient voltage to be sensed may occur within current sensor 200. The voltage sensing element 222 may also be connected to circuitry 223 supported by the substrate 202. In other embodiments, the voltage sensing element 222 may be connected to bond pad 220 through the conductive element 224. An electromagnetic shield is not shown in FIG. 2 to illustrate that in some embodiments the shield may be eliminated. In other embodiments, however it should be appreciated that the electromagnetic shield may be provided (e.g., see FIGS. 1-1A). For example, first surface 202a of substrate 202 may include a shielded region and an unshielded region. In such embodiments, the electromagnetic shield may be disposed on the shielded region of the first surface 202a and electrode 222 may be disposed in the unshielded region.

In operation, lead frame 260 can be configured to form a current loop 262. Magnetic field sensing element 210 can be positioned such that it is near the current loop 262. For example, and as illustrated in FIG. 2, magnetic field sensing element 210 can be positioned on an inside portion of the current loop 262 (e.g., such as an arrangement that may be used when magnetic field sensing element 210 includes a planar Hall element). However, it should be appreciated that the position of the magnetic field sensing element 210 may be moved over the current loop 262 or otherwise arranged for other magnetic field sensing element types and applications.

In an embodiment, current sensor 200 may have a current 230 enter one or more of the plurality of leads 260a-260h (here leads 260c, 260d), flow through the current loop 262 near the magnetic field sensing element 210 disposed on the first surface 202a of the substrate 202 and exit the integrated circuit package through one or more of the plurality of leads 260a-260h (here leads 260a, 260b). Electrode 222 can be positioned on the first surface 202a such that it is proximate to the current carrying path of the lead frame 260, for example, but not limited to the current loop 262. Thus, in an embodiment, electrode 222 may form one side of a capacitance 272 between the electrode 222 and the conductor 261 and permit a voltage of the conductor 261 to be sensed. More particularly, current conductor 261 may form one side of capacitor 272 and at least one lead 260g of lead frame 260 may form a second side of capacitor 272. Thus, a rate of change of a voltage across capacitance 272 can be detected. In some embodiments, capacitance 272 may be coupled to or part of a threshold circuit used to detect the rate of change of a voltage, such as threshold circuit 166 of FIG. 1A, circuitry 211, 223 of FIGS. 2-2A or threshold circuit 300 of FIG. 3.

In some embodiments, bond pads may be configured to provide as a supply voltage (Vcc) connection 212, an output (Vout) connection 214, and a ground (GND) connection 216. However, it should be appreciated that other configurations and arrangements of the leads and bond pads may be used. For example, in one embodiment, a two wire output may be used (i.e., where the sensor output is indicated as a change in current on the Vcc or ground connections), and multiple output connections can provide a digital word output in a parallel manner. In other embodiments, a serial digital output may also be provided at output terminal 214. The bond pad 220 which connects to sensing electrode 222 may be directly coupled, or may be a fault indication output of a voltage sensing element state within the circuitry 223.

In some embodiments, electrode 222 may be coupled to circuitry 211 and circuitry 211 may be coupled to magnetic field sensing element 210. Circuitry 211 may be coupled to an output connection 214. Thus, an output of electrode 222 and/or magnetic field sensing element 210 may be provided through output connection 214. In some embodiments, electrode 222 may be coupled to circuitry 223 and circuitry 223 may be coupled to circuitry 211. Thus, an output of circuitry 223 may be provided through output connection 214 and at least one of the plurality of leads 260f The output of circuitry 223 may provide an indication of a voltage transient event within current sensor 200.

In some embodiments, one or more insulating layers may be applied to, disposed on or otherwise formed on first surface 202a. In an embodiment, the insulating layer may include a nitride, or oxide layer, or a combination of inorganic deposited layers, a polymer insulating layer such as a polyimide, benzocyclobutene (BCB), SU-8, or other polymer layer. In another embodiment, a layer of insulating or dielectric tape may be used, for example a Kapton® tape. In some embodiments, the insulating layer may be part of the substrate 202. For clarity, the insulating layer or layers are not shown in FIG. 2.

In some embodiments, substrate 202 may not include electrode 222 and a voltage transient may be detected by circuitry separate from the substrate 202 (e.g., sensed off chip). For example, and now referring to FIG. 2A, a current sensor 270 is provided that is similar to current sensor 200 of FIG. 2, however, current sensor 270 does not include a voltage sensing element 222 and instead a rate of change of a voltage is detected across a discrete capacitor 272' between current conductor 261 adjacent to a surface of substrate 202 and at least one lead 260g of lead frame 260 that is electrically coupled to substrate 202.

Figure 2A:
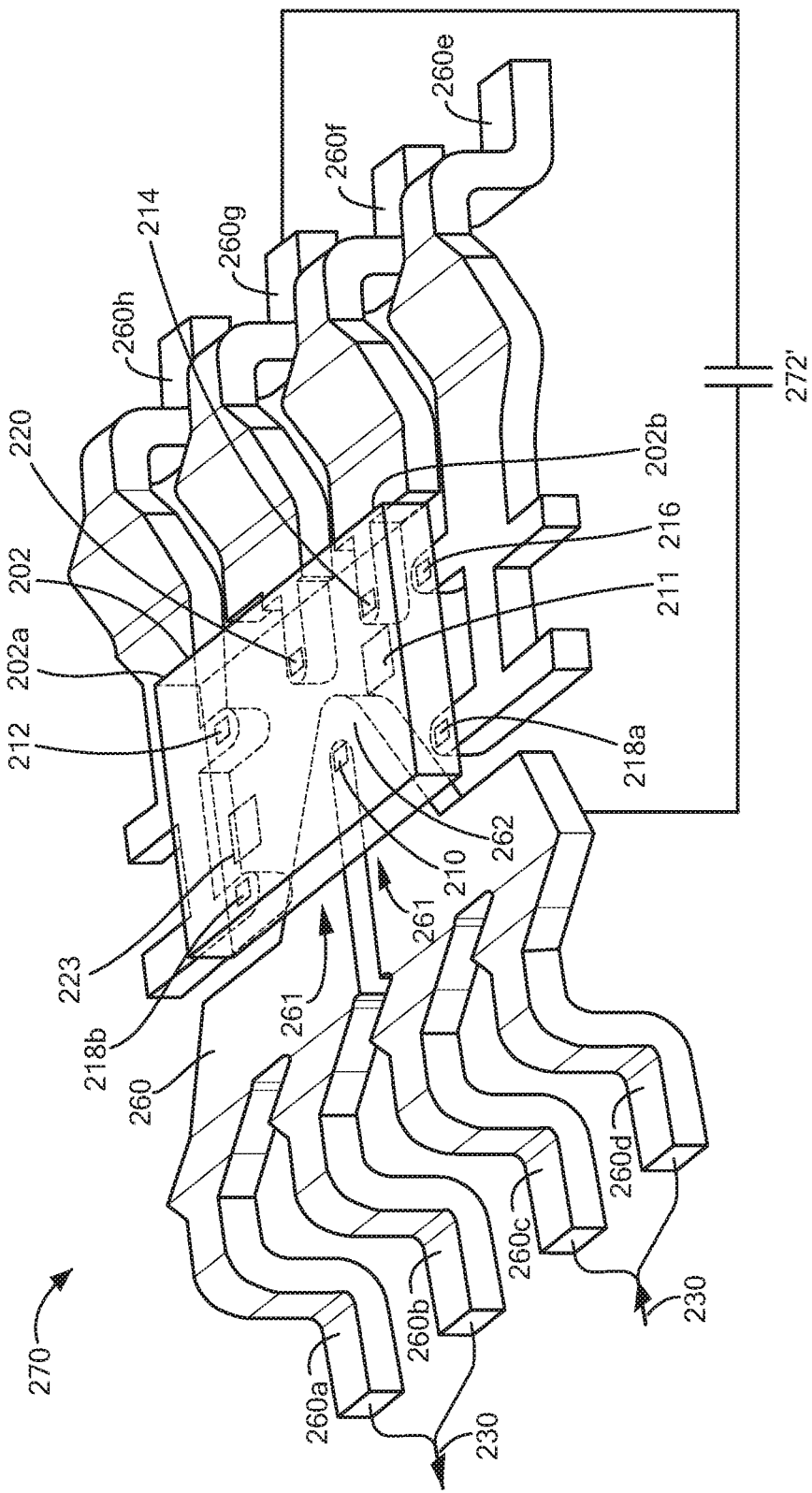
FIG. 2A is an isometric view of an alternative current sensor having a sensing element coupled to a lead frame.
Figure 3:
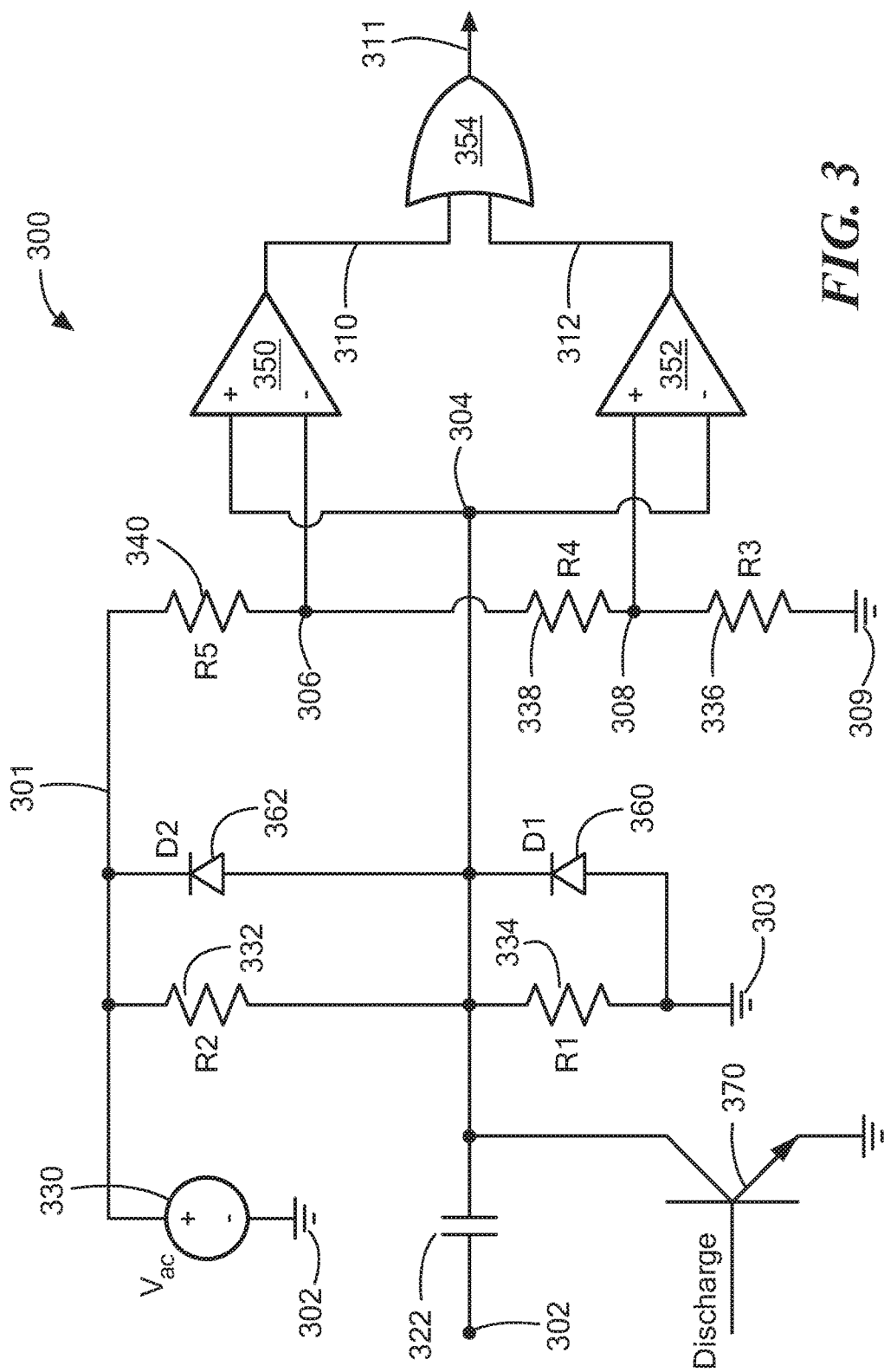
FIG. 3 is a simplified schematic of a circuit for detecting a voltage transient.

Now referring to FIG. 3, a threshold circuit 300 to detect a rate of change in a voltage across a capacitance 322 is provided. Circuit 300 includes a first node 302 that forms one side of a capacitor 322 and a second node 304 that forms a second side of capacitor 322. In an embodiment, and referring briefly back to FIG. 2, current loop 262 may form one electrode (plate) of capacitor 322 at node 302 and electrode 222 may form a second electrode (plate) of capacitor 322 at node 304. For example, current loop 262 may correspond to node 302 and electrode 222 may correspond to node 304. Thus, circuit 300 may detect a rate of change of a voltage across a capacitance between current loop 262 and electrode 222. Thus, capacitor 322 may be the same as or substantially similar to capacitor 272' of FIG. 2A.

In an embodiment, a voltage source 330 may be coupled between node 301 and node 302. Node 302 may be a ground voltage or some other reference potential.

A first resistor 332 may have a first terminal coupled to node 301 and a second terminal coupled to node 304. A first diode 362 may have a first terminal (e.g., cathode) coupled to node 301 and a second terminal (e.g., anode) coupled to node 304.

A second resistor 334 may have a first terminal coupled to node 304 and a second terminal coupled to node 303. Node 303 may be a ground voltage or some other reference potential. In some embodiments, node 303, node 302 and node 309 may be at the same reference potential voltage. A second diode 360 may have a first terminal (e.g., cathode) coupled to node 304 and a second terminal (e.g., anode) coupled to node 303.

A third resistor 336 may have a first terminal coupled to node 309 and a second terminal coupled to node 308. A fourth resistor 338 may have a first terminal coupled to node 308 and a second terminal coupled to node 306. A fifth resistor 340 may have a first terminal coupled to node 306 and a second terminal coupled to node 301.

A transistor 370 may be provided between node 304 and node 309. For example, a collector terminal may be coupled to node 304, a base terminal coupled to a reference voltage and emitter terminal may be coupled to node 309. In an embodiment, transistor 370 may be provided to allow capacitor 322 to discharge in response to a discharge control signal. In some embodiments, the discharge control signal may be generated and provided threshold circuit 300 by circuitry 211, 223 of current sensor 200.

A first comparator 350 may have a first input terminal (e.g., non-inverting terminal) coupled to node 304, a second input terminal (e.g., inverting terminal) coupled to node 306 and an output 310. A second comparator 352 may have a first input terminal (e.g., non-inverting terminal) coupled to node 308, a second input terminal (e.g., inverting terminal) coupled to node 304 and an output 312. A logic gate 354 (e.g., OR-gate, AND gate) may have a first input terminal coupled to a comparator output 310, a second input terminal coupled to comparator output 312, and an OR-gate output terminal coupled to node 314.

First comparator 350 may receive a first input voltage from node 304 and a second input voltage from node 306. Second comparator 352 may receive a first input voltage from node 308 and a second input voltage from node 304. In some embodiments, an input voltage at nodes 306 and node 308 may correspond to a reference voltage and an input voltage at node 304 may correspond to a voltage at an electrode (e.g., electrode 222 of FIG. 2). Thus, comparator 350 may provide an output (e.g., comparison signal) at a first level when a rate of change of the voltage across the capacitance 322 is greater than a first predetermined level established by the threshold voltage at node 306 and at a second level when the rate of change of the voltage across the capacitance 322 is less than the first predetermined level. Comparator 352 may provide an output at a first level when a rate of change of the voltage across the capacitance is greater than a second predetermined level established by the threshold voltage at node 308 and at a second level when the rate of change of the voltage across the capacitance 322 is less than the second predetermined level. First and second comparator outputs 310, 312 may be provided to logic gate 354 and first and second inputs respectively.

Logic gate 354 may generate an output (e.g., comparison signal) of circuit 300 at node 314 at a first level when a rate of change of the voltage across the capacitance 322 is greater than the first predetermined level or less than the second predetermined level. In this manner, the circuit 300 may operate as a window comparator. It will be appreciated that the values of resistors 336, 338, 340 can be selected to establish desired signal levels for detection of a dV/dt event. Logic gate 354 may generate an output (e.g., comparison signal) of circuit 300 at node 314 at a second level when the rate of change of the voltage across the capacitance 322 is less than the first predetermined level.

In some embodiments, an absolute value of the rate of change of the voltage across the capacitance 322 may be compared to the first predetermined level established by the threshold voltage at node 306 and/or the second predetermined level established by the threshold voltage at node 308. For example, in one embodiment, if the absolute value of the rate of change of the voltage across the capacitance 322 is positive, comparator 350 may trip and provide the corresponding output signal at the second level. If the absolute value of the rate of change of the voltage across the capacitance 322 is negative, comparator 352 may trip and provide the corresponding output signal at the first level. Thus, the output of logic gate 354 may be responsive to the absolute value of the rate of change of the voltage across the capacitance 322 being greater than the first predetermined level or less than the second predetermined level.

In some embodiments, node 314 may be coupled to a bond pad of the integrated circuit sensor IC for further coupling to a signal lead, for example lead 260g of FIGS. 2-2A. In another embodiment, node 314 may be coupled to another circuit on the chip, for example but not limited to circuitry 211 of FIG. 2.

Diodes 360, 362 are provided to clamp the voltage associated with a voltage transient in order to protect the circuit 300 from excessive transient events. Although in FIG. 3 circuit 300 is provided having first and second diodes 362, 360, it should be appreciated that in some embodiments, circuit 300 may not include first and second diodes 362, 360.

Figure 4:
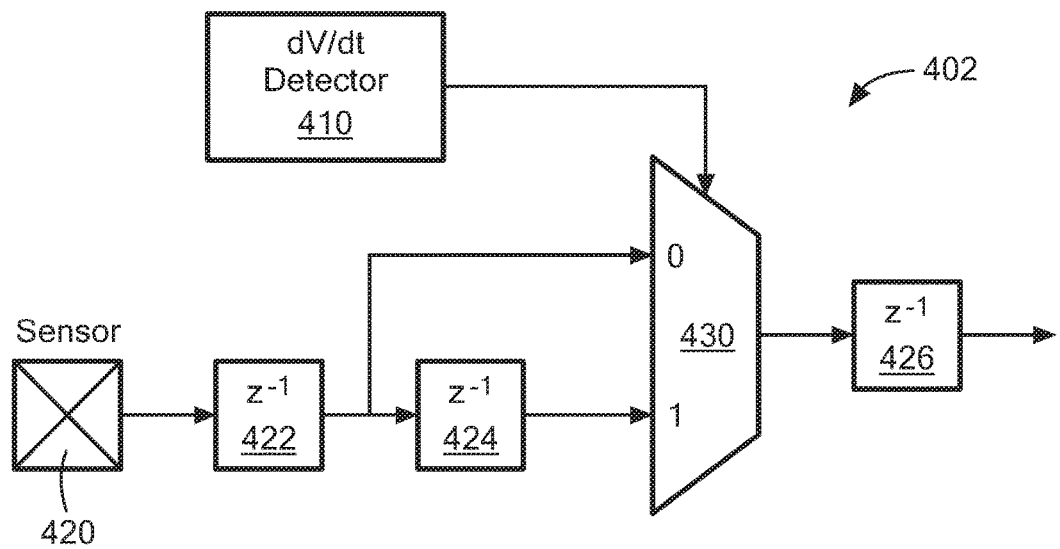
FIG. 4 is a block diagram of a first embodiment of a circuit for controlling an output of a magnetic field sensor integrated circuit based on detection of a voltage transient.
Figure 4A:
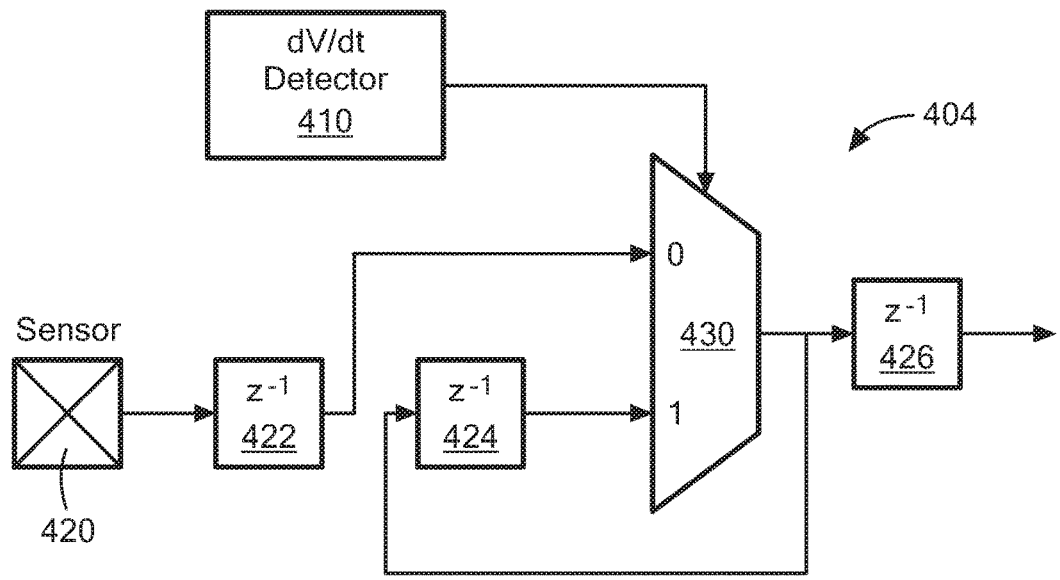
FIG. 4A is a block diagram of a second embodiment of a circuit for controlling an output of a magnetic field sensor integrated circuit based on detection of a voltage transient.
Figure 4B:
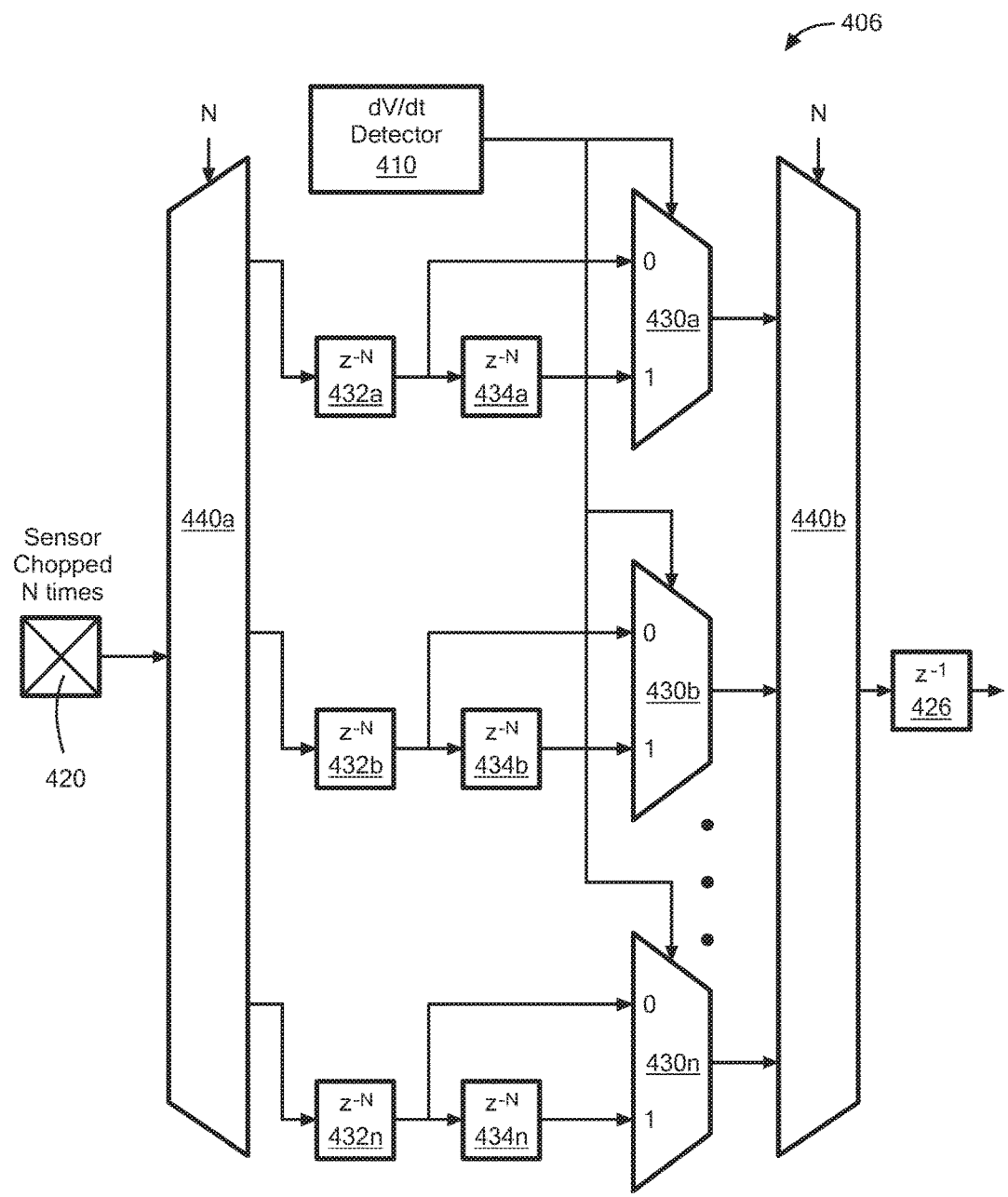
FIG. 4B is a block diagram of a third embodiment of a circuit for controlling an output of a magnetic field sensor integrated circuit based on detection of a voltage transient.
Figure 4C:
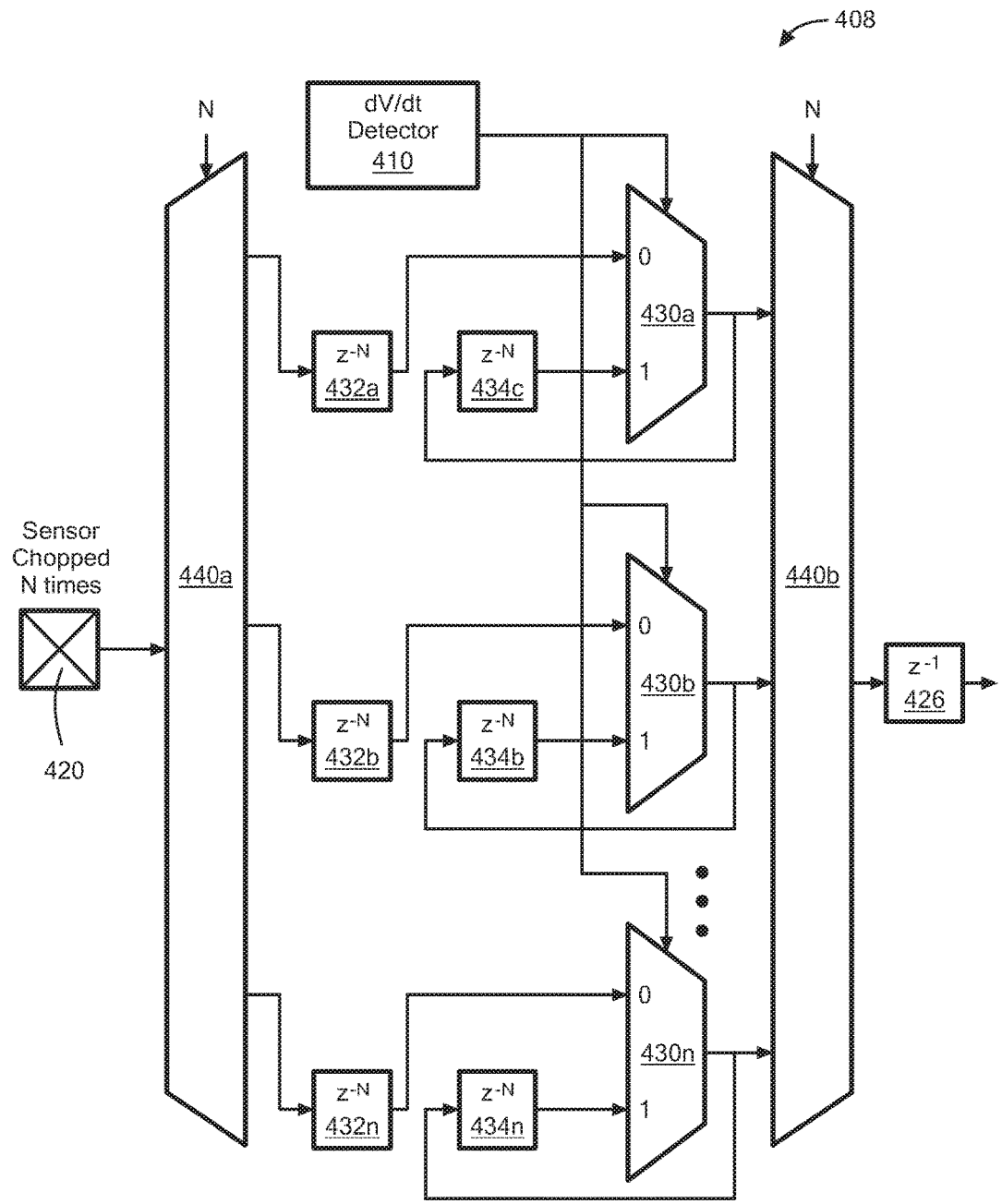
FIG. 4C is a block diagram of a fourth embodiment of a circuit for controlling an output of a magnetic field sensor integrated circuit based on detection of a voltage transient.
Figure 4D:
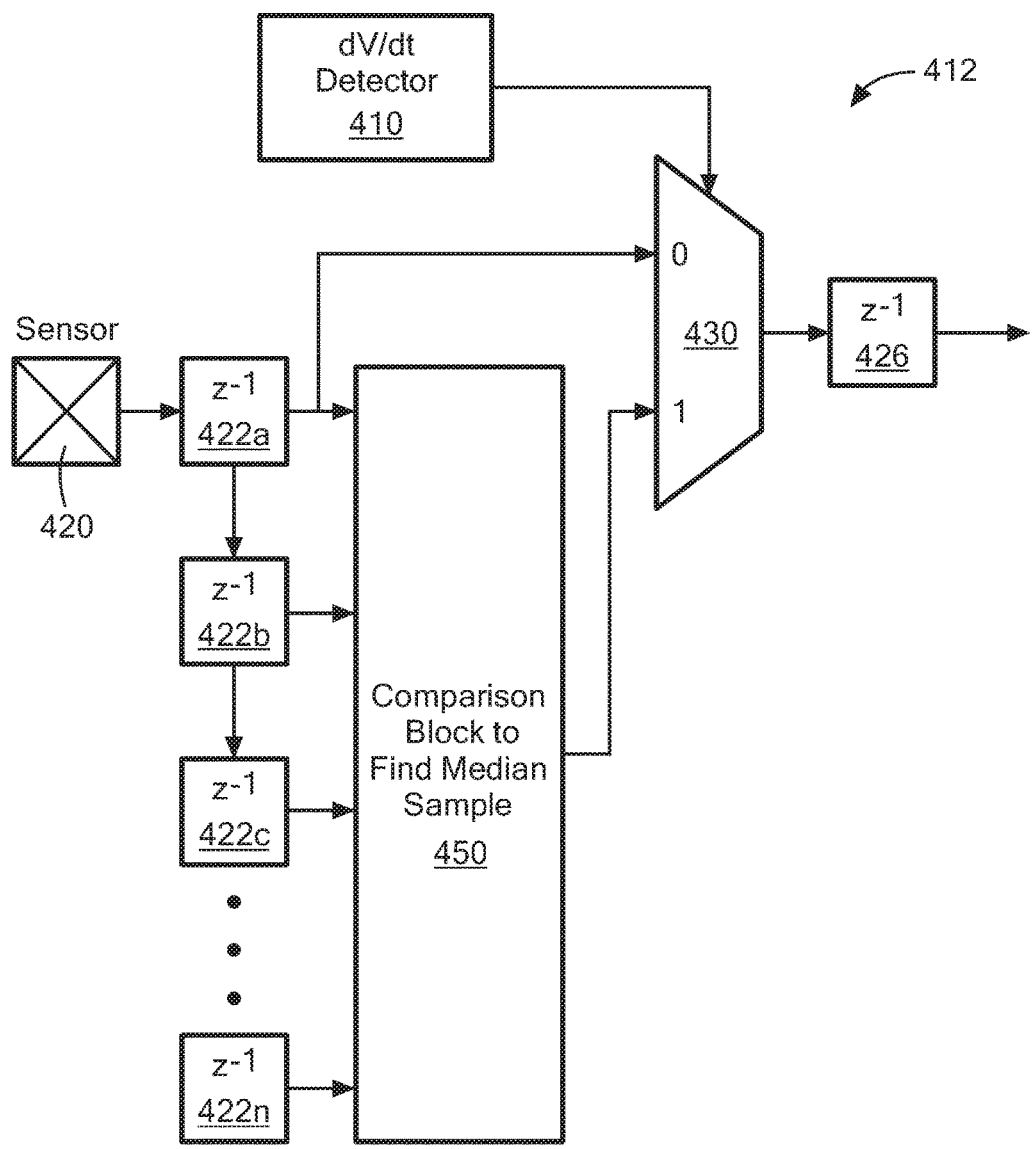
FIG. 4D is a block diagram of a fifth embodiment of a circuit for controlling an output of a magnetic field sensor integrated circuit based on detection of a voltage transient.
Figure 4E:
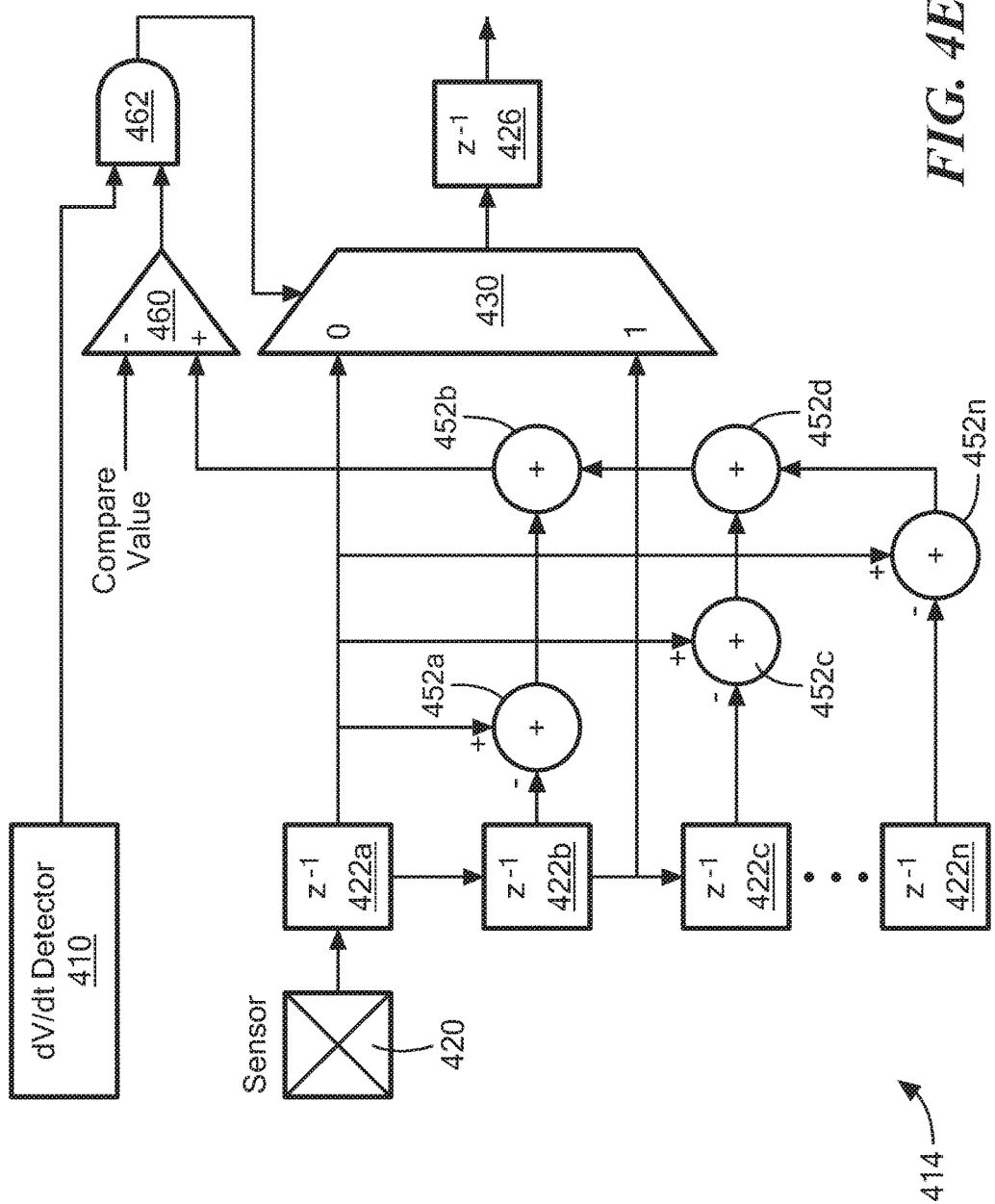
FIG. 4E is a block diagram of a sixth embodiment of a circuit for controlling an output of a magnetic field sensor integrated circuit based on detection of a voltage transient.
Figure 4F:
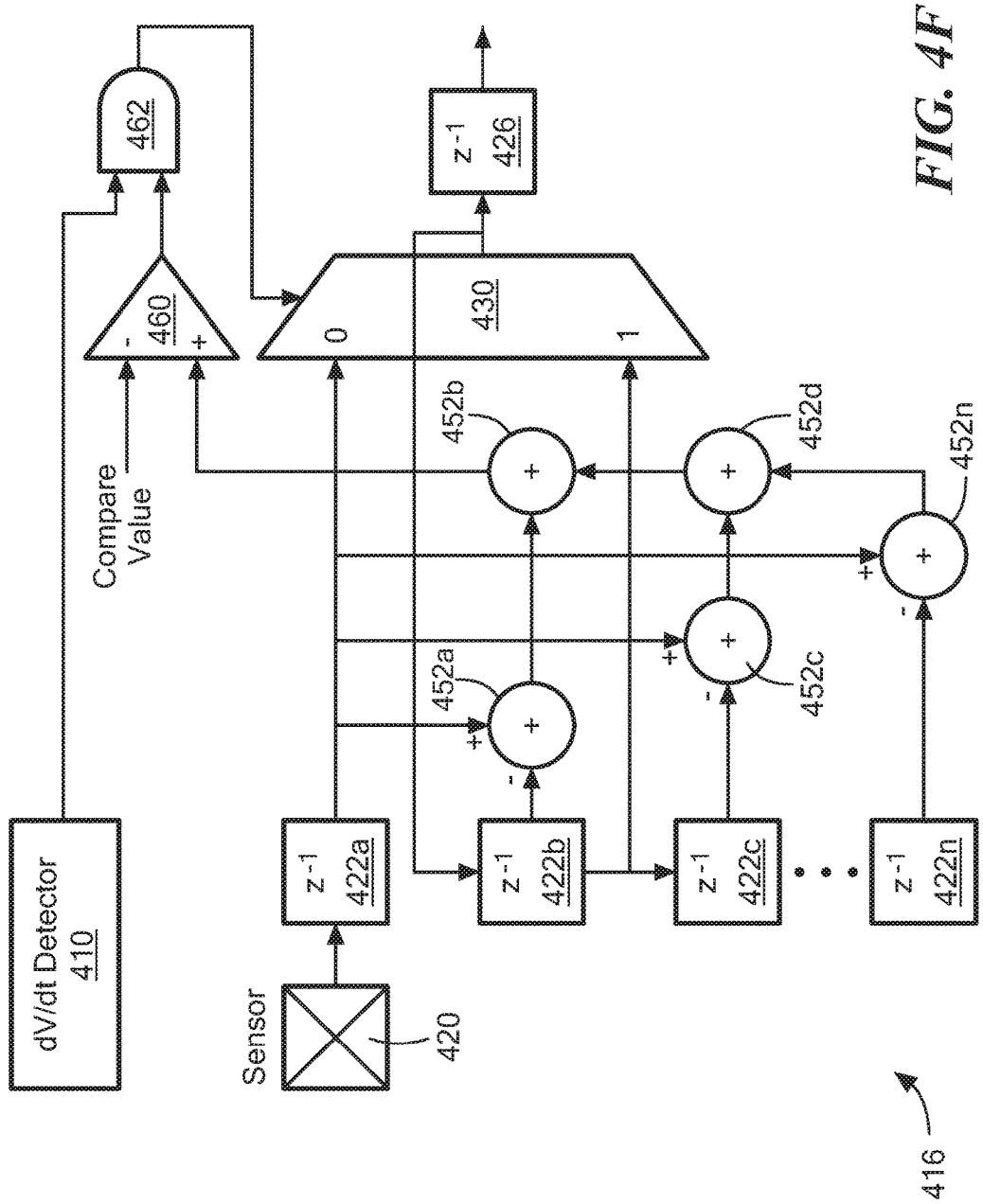
FIG. 4F is a block diagram of a seventh embodiment of a circuit for controlling an output of a magnetic field sensor integrated circuit based on detection of a voltage transient.

Now referring to FIGS. 4-4F, in which like designations indicate like elements, sampling circuits 402, 404, 406, 408, 412, 414, 416 are provided to control an output of a magnetic field sensor IC and/or a current sensor, such as magnetic field sensor IC 100 of FIG. 1 and/or current sensors 150, 200 and 270 of FIGS. 1A, 2, and 2A respectively.

The output of each of circuits 402, 404, 406, 408, 412, 414, 416 may be the output of magnetic field sensor IC 100 of FIG. 1 and/or current sensors 150, 200 and 270 of FIGS. 1A, 2, and 2A respectively. For example, each of the sampling circuits 402, 404, 406, 408, 412, 414, 416 may be configured to sample and/or delay one or more outputs of sensor 420 (which sensor may include one or more magnetic field sensing elements and processing circuitry for processing the magnetic field sensing element output to generate a sensor output) such that when a voltage transient (high dV/dt event) is detected, then one or more samples affected by the voltage transient can be ignored and a previous uncorrupted sample can be provided as an output.

In an embodiment, sensor 420 may include magnetic field sensor IC 100 of FIG. 1 or current sensors 150, 200 and 270 of FIGS. 1A, 2, and 2A respectively. dV/dt detector 410 may include threshold circuit 166 of FIG. 1A, circuitry 211, 223 of FIGS. 2-2A and/or threshold circuit 300 of FIG. 3. Thus, an output of dV/dt detector 410 may correspond to an output of threshold circuit 166 of FIG. 1A, circuitry 211, 223 of FIGS. 2-2A and threshold circuit 300 of FIG. 3 and may take the form of a signal at a first level to indicate an occurrence of a dV/dt event and at a second level in the absence of detection of a dV/dt event.

Referring to FIG. 4, circuit 402 includes dV/dt detector 410, sensor 420, a multiplexer 430 and a plurality of delay devices 422, 424, 426. In an embodiment, the output of sensor 420 can be sampled at a predetermined rate or cycle and both current and previous samples can be saved in each of delay devices 422, 424, 426. For example, delay devices 422, 424, 426 may hold and delay an input for the predetermined rate or cycle (e.g., sample time period, 1 cycle, N cycles, etc.). Thus, a first delay device 422 and a second delay device 424 can hold output samples from sensor 420. For example, in some embodiments, sensor 420 may provide a current sample (e.g., most recent sample) to first delay device 422 and first delay device 422 may provide a previously received sample to a second delay device 424. Thus, first delay device 422 may provide the current sample and second delay device 424 may provide the previous sample to multiplexer 430.

In an embodiment, dV/dt detector 410 can be configured to detect a rate of change of a voltage across a capacitance, for example, between a current conductor and an electrode proximate to the conductor (e.g., FIG. 2) or a rate of change of a voltage across a discrete capacitance coupled between a current conductor and a lead frame of a lead frame (e.g., FIG. 2A). dV/dt detector 410 can generate a comparison signal at a first level when the rate of change of the voltage across the capacitance is greater than a first predetermined level or at a second, opposite level when the rate of change of the voltage across the capacitance is less than a second predetermined level.

In operation, when no voltage transient is detected, dV/dt detector 410 can provide the comparison signal at the second level to multiplexer 430 and the current sample from first delay device 422 can be selected by the multiplexer 430 for coupling to the third delay device 426 and thus provide the output of circuit 402. In some embodiments, the previous sample of sensor 420 provided by second delay device 424 may be updated when the comparison signal is at the second level and can be held or otherwise retained when the comparison signal is at the first level.

When a voltage transient is detected, dV/dt detector 410 can provide the comparison signal at the first level to multiplexer 430 and the previous sample from second delay device 424 can be selected by the multiplexer 430 for coupling to the third delay device 426 to generate the output of circuit 402. In this way, when a voltage transient is detected the sensor output signal is ignored.

Referring to FIG. 4A, circuit 404 includes dV/dt detector 410, sensor 420, multiplexer 430 and a plurality of delay devices 422, 424, 426. Circuit 404 is similar to circuit 402 of FIG. 4, except that the input to second delay device 424 in circuit 404 is the output of multiplexer 430. Thus, circuit 404 can be configured to ignore multiple corrupt sensor output signal samples if they occur sequentially.

In an embodiment, first sample device 422 can provide a current sample of the output of sensor 420 to multiplexer 430 as a first input and second delay device 424 can provide a previous sample of the output of sensor 420 to multiplexer 430 as a second input. The previous output of multiplexer 430 provided at the output of delay device 424 can be considered to be a "valid sample" since it was selected by the multiplexer to provide the circuit output.

In operation, circuit 404 may select between the current sample from delay device 422 and valid sample from delay device 424 and if multiple corrupt samples are detected, each corrupt sample can be ignored until a new current sample is provided that isn't corrupt (no voltage transient detected). In an embodiment, multiplexer 430 can continue to select the previous sample that was flagged to be valid (from the output of delay device 424) until a new current sample (from delay device 422) that is valid is input into multiplexer 430. In other words, the output of circuit 404 may get updated when the current sample is valid (i.e., when the comparison signal from the dV/dt detector 410 is at the second level). If the current sample is corrupt (i.e., when the comparison signal is at the first level), then the saved previous sample continues to provide the output of circuit 404 until there is a new, good value.

Referring to FIG. 4B, circuit 406 includes dV/dt detector 410, sensor 420, a plurality of first multiplexers 430a-430n, a plurality of second multiplexers 440a-440b, and a plurality of delay devices 432a-432n, 434a-434n, 426.

Circuit 406 is similar of circuit 402 of FIG. 4, however sampling of the sensor output is extended to N chopping cycles. For example, and as illustrated in FIG. 4B, circuit 406 includes N chopping cycles and each chopping cycle includes first delay device 432, second delay device 434 and multiplexer 430.

Sensor 420 can be sampled (i.e., chopped) N times and each of the N samples can be provided to multiplexer 440a. Multiplexer 440a can have N outputs. For example, at least one output for each of the N chopping cycles. In each chopping cycle, first delay device 432a-432n and second delay device 434a-434n can hold output samples from sensor 420 and provide them to a respective multiplexer 430a-430n. First delay devices 432a-432n may provide a current sample and second delay devices 434a-434n may provide a previous sample to the respective multiplexer 430a-430n. Each of multiplexers 430a-430n can provide an output to multiplexer 440b. For example, multiplexer 440b can have at least one input provided from each of the N chopping cycles.

In operation, when no voltage transient is detected, the current samples from first delay devices 432a-432n can be selected by multiplexer 440b for coupling to the third delay device 426 and thus provide output of circuit 406. When a voltage transient is detected, dV/dt detector 410 can provide a comparison signal at a first level causing multiplexers 430a-430n to select the previous samples from second delay devices 434a-434n and to thereby ignore the current samples from first delay devices 432a-432n.

Referring to FIG. 4C, circuit 408 includes dV/dt detector 410, sensor 420, a plurality of first multiplexers 430a-430n, a plurality of second multiplexers 440a-440b, and a plurality of delay devices 432a-432n, 434a-434n, 426.

Circuit 408 is similar to circuit 404 of FIG. 4A, however the sampling is extended to N chopping cycles. For example, and as illustrated in FIG. 4C, circuit 408 includes N chopping cycles and each chopping cycle includes first delay device 432, second delay device 434 and multiplexer 430.

Circuit 408 can be configured to ignore multiple corrupt samples in each of the N chopping cycles if they occur sequentially. In operation, sensor 420 can be sampled (chopped) N times and each of the N samples can be provided to multiplexer 440a. Multiplexer 440a can have N outputs. For example, at least one output for each chopping cycle. In each chopping cycle, each of first delay devices 432a-432n can provide a current sample to at least one multiplexer 430a-430n as a first input and each of second delay devices 434a-343n can provide a previous output of multiplexers 430a-430n to the same multiplexer 430a-430n as a second input. The previous outputs of multiplexers 430a-430n can be a previous sample that was flagged to be valid (no voltage transient detected).

In an embodiment, circuit 408 may select the previously approved samples and if multiple corrupt samples are detected in one or more chopping cycles, each corrupt sample can be ignored until a new current sample is provided in the respective chopping cycle that isn't corrupt (no voltage transient detected). In an embodiment, each of multiplexers 430a-430n can continue to provide the previous sample that was flagged to be valid to multiplexer 440b until a new current sample that is valid is input into multiplexers 430a-430n. In other words, the output of circuit 404 may get updated when the current sample is valid. If the current sample is corrupt, then the saved previous sample continues to be output by the circuit 408 until there is a new, valid sample.

Referring to FIG. 4D, circuit 412 includes dV/dt detector 410, sensor 420, multiplexer 430, a filter 450 and a plurality of delay devices 422a-422n, 426.

In circuit 412, filter 450 can be configured to reduce or eliminate errors due to voltage transients. For example, the output of sensor 420 can be sampled and a current sample can be provided to first delay device 422a, which delay device 422a provides the previous sensor output sample to a first input of multiplexer 430. A previous sample can be provided to second delay device 422b and each successive previous sample can be provided to delay devices 422c-422n respectively, as shown. An output of each of delay devices 422a-422n (that can be the same output that is provided to a subsequent delay device 422b-422n) can be provided to a respective input of filter 450. In an embodiment, filter 450 can be configured to generate a median sample based on each of the samples received.

In an embodiment, filter 450 can store multiple samples and generate the median sample value of the multiple samples to ignore a voltage transient event. In some embodiments, filter 450 can store an odd number of at least three previous samples of the magnetic field signal of sensor 420 and compute a median value of the stored previous samples of the magnetic field signal of sensor 420. For example, in one embodiment, filter 450 can store three or more odd number of samples and the median sample can be based on those samples. The three samples may be used to limit the effect of a single voltage transient event within the three samples. In other embodiments, five samples may be used to generate the median sample value. Filter 450 can provide the median sample, the median value of the stored previous samples of the magnetic field signal of sensor 420, to a second input of multiplexer 430.

In an embodiment, the output of first delay device 422a (i.e., a current sample) can be provided to a first input of multiplexer 430. Filter 450 can provide the median sample to a second input of multiplexer 430. A third input of multiplexer 430 can be coupled to dV/dt detector 410. dV/dt detector 410 can provide the comparison signal at the first level as an indication of when a voltage transient is detected and at the second level when no voltage transient is detected.

In operation, when no voltage transient is detected, the output of first delay device 422a (i.e., the current sample) can be selected by multiplexer 430 for coupling to third delay device 426 and thus provide the output of circuit 412. When a voltage transient event is detected, the dV/dt detector 410 can provide a comparison signal at the first level causing multiplexer 430 to select the median sample from filter 450 for coupling to third delay device 426 and thus provide the output of circuit 412.

In an embodiment, the delay of filter 450 can reject single samples in which a voltage transient event occurs and thus differentiate from the other samples provided to filter 450. In some embodiments, this may provide a better estimate of a true signal, as in the case where the voltage transient event does not disturb the sensor and the sample is not ignored.

Referring to FIG. 4E, circuit 414 includes dV/dt detector 410, sensor 420, multiplexer 430, a comparator 460, a logic gate (e.g., AND gate, OR gate) 462, sum devices 452a-452n and a plurality of delay devices 422a-422n, 426.

In an embodiment, sensor 420 can be sampled and a current sample can be provided to a first delay device 422a, which delay device 422a provides the previous sensor output sample to a first input of multiplexer 430. A previous sample can be provided to second delay device 422b and each successive previous sample delay devices 422c-442n. In an embodiment, the output of delay devices 422b-422n can be provided as inputs into one of a plurality of sum devices 452a-452n.

In an embodiment, sum devices 452a-452n can be configured to combine a difference between two samples to generate a difference sample. For example, each sum device 452a-452n can have a positive input and a negative input. Thus, a first sample is combined with a negative (e.g., opposite) version of a second sample. In one embodiment, a first sample from a first delay device 422a can be provided to the positive input of sum device 422a and a second sample from a different second delay device 422b can be provided to the negative input of sum device 422a. Sum device 422a can compare the differences between the first and second sample to generate a difference sample. In an embodiment, sum devices 452a-452n can be configured to store a difference between a current sample of a magnetic field signal of sensor 420 and a previous sample of the magnetic field signal of sensor 420.

In some embodiments, sum devices 452a-452n can be organized in different stages in order to generate a single difference sample based on a plurality of samples from each of delay devices 452a-452n. For example, in one embodiment, a current sample from first delay device 422a can be combined with a previous sample from each of delay devices 422b-422n using a plurality of sum devices 452a, 452c, 452n in a first stage. Each of the sum devices 452a, 452c, 452n in the first stage can generate difference samples based on differences between the current sample and each of the previous samples. The difference samples from each of the sum devices 452a, 452c, 452n in the first stage can be provide as inputs into a plurality of sum devices 452b, 452d in a second stage. It should be appreciated that circuit 414 may include more than two stages of sum devices 452a-452n. In an embodiment, the number sum devices 452a-452n and the number of stages may depend on the number of delay devices 422a-422n and samples to be combined and a particular application of circuit 414.

An output of the plurality of sum devices 452a-452n in the second stage can correspond to a difference between the current sample and each of the previous samples. In an embodiment, the output of the plurality of sum devices 452a-452n in the second stage can be provided to a second input of comparator 460. A threshold value (e.g., compare value) can be provided to a first input of comparator 460. Comparator 460 can compare the output of the plurality of sum devices 452a-452n to the threshold value to generate a difference signal. An output (e.g., difference signal) of comparator 460 may indicate the greater of the two values and be provided to a first input of logic gate 462. In an embodiment, the difference signal may be at a first level when no voltage transient is detected and at a second, opposite, level when a voltage transient is detected. For example, if the output of the plurality of sum devices 452a-452n is greater than the threshold value, comparator 460 may output the difference signal at the second level. If the threshold value is greater than the output of the plurality of sum devices 452a-452n, comparator 460 may output the difference signal at the first level.

A second input of logic gate 462 may be coupled to dV/dt detector 410 and be configured to receive a comparison signal at a first level to indicate the voltage transient event. In an embodiment, if the output of the plurality of sum devices 452a-452n is greater than the threshold value, and a voltage transient event is detected, logic gate 462 may provide an indication of the voltage transient event to multiplexer 430. If the threshold value is greater than the output of the plurality of sum devices 452a-452n, may provide no indication to multiplexer 430 or provide an indication of a valid current sample to multiplexer 430.

Although illustrated as an AND gate in FIG. 4E, it should be appreciated that in some embodiments, logic gate 462 may be an OR gate. For example, in some embodiments, the detection of a voltage transient event or a difference between the output of the plurality of sum devices 452a-452n and the threshold value may cause logic gate 462 to transmit an indication to multiplexer 430 to reject (e.g., ignore) a current sample and a previous sample may be output by multiplexer 430.

In operation, a first input of multiplexer 430 may be coupled to and configured to receive a current sample from a first delay device 422a. A second input of multiplexer 430 may be coupled to and configured to receive a previous sample from a second delay device 422b. A third input of multiplexer 430 may be coupled to and configured to receive the output of logic gate 462 and thus an indication of the voltage transient event. When a voltage transient is detected, multiplexer 430 may select the previous sample for coupling to delay device 426 and thus provide the output of circuit 414. When no voltage transient is detected, multiplexer 430 may select the current sample for coupling to delay device 426 and thus provide the output of circuit 414.

Referring to FIG. 4F, circuit 416 includes dV/dt detector 410, sensor 420, multiplexer 430, comparator 460, logic gate (e.g., AND gate, OR gate) 462, sum devices 452a-452n and delay devices 422a-422n, 426.

In an embodiment, circuit 416 may similar to circuit 414, however the input to second delay device 422b is the output of multiplexer 460 and each successive output of multiplexer 430 can be the input to delay devices 422c-422n respectively. Thus, circuit 416 can be configured to ignore multiple corrupt sensor output signal samples if they occur sequentially.

In an embodiment, first delay device 422a may receive the current sample and delay devices 422b-422n receive different previous outputs of multiplexer 430. The differences between each of the outputs of delay devices 422a-422n can be determined using sum devices 452a-452n.

In an embodiment, sum devices 452a-452n can be configured to combine a difference between two samples to generate a difference sample. For example, each sum device 452a-452n can have a positive input and a negative input. Thus, a first sample is combined with a negative (e.g., opposite) version of a second sample. In one embodiment, a current sample from a first delay device 422a can be provided to the positive input of sum devices 452a-452n and a previous output of multiplexer 430 from each of delay devices 422b-422n can be provided to the negative input of at least one of sum devices 452a-452n. Sum devices 452a-452n can compare the differences between the current sample and previous outputs of multiplexer 430 to generate a difference sample. In an embodiment, sum devices 452a-452n can be configured to store a difference between a current sample of a magnetic field signal of sensor 420 and a previous sample of the magnetic field signal of sensor 420.

In some embodiments, sum devices 452a-452n can be organized in different stages in order to generate a single difference sample based on a plurality of samples from each of delay devices 452a-452n. For example, sum devices 452a, 452c, 452n in the first stage can generate difference samples that can be combined using a plurality of sum devices 452b, 452d in a second stage. It should be appreciated that circuit 416 may include more than two stages of sum devices 452a-452n. In an embodiment, the number sum devices 452a-452n and the number of stages may depend on the number of delay devices 422a-422n and samples to be combined and a particular application of circuit 416.

An output of the plurality of sum devices 452a-452n in the second stage can correspond to a difference between the current sample and each of the previous outputs of multiplexer 430. In an embodiment, the output of the plurality of sum devices 452a-452n in the second stage can be provided to a second input of comparator 460. A threshold value (e.g., compare value) can be provided to a first input of comparator 460. Comparator 460 can compare the output of the plurality of sum devices 452a-452n to the threshold value to generate a difference signal. An output (e.g., difference signal) of comparator 460 may indicate the greater of the two values and be provided to a first input of logic gate 462. In an embodiment, the difference signal may be at a first level when no voltage transient is detected and at a second, opposite, level when a voltage transient is detected. For example, if the output of the plurality of sum devices 452a-452n is greater than the threshold value, comparator 460 may output the difference signal at the second level. If the threshold value is greater than the output of the plurality of sum devices 452a-452n, comparator 460 may output the difference signal at the first level.

A second input of logic gate 462 may be coupled to dV/dt detector 410 and be configured to receive a comparison signal at a first level to indicate the voltage transient event.

In an embodiment, if the output of the plurality of sum devices 452a-452n is greater than the threshold value, and a voltage transient event is detected, logic gate 462 may provide an indication of the voltage transient event to multiplexer 430. If the threshold value is greater than the output of the plurality of sum devices 452a-452n, may provide no indication to multiplexer 430 or provide an indication of the valid current sample to multiplexer 430.

Although illustrated as an AND gate in FIG. 4F, it should be appreciated that in some embodiments, logic gate 462 may be an OR gate. For example, in some embodiments, the detection of a voltage transient event or a difference between the output of the plurality of sum devices 452a-452n and the threshold value may cause logic gate 462 to transmit an indication to multiplexer 430 to reject (e.g., ignore) a current sample and a previous sample may be output by multiplexer 430.

In operation, a first input of multiplexer 430 may be coupled to and configured to receive a current sample from a first delay device 422a. A second input of multiplexer 430 may be coupled to and configured to receive a previous output of multiplexer 430 from a second delay device 422b. The previous output of multiplexer 430 can be considered to be a "valid sample" since it was selected by the multiplexer 430 to provide the output of circuit 416. A third input of multiplexer 430 may be coupled to and configured to receive the output of logic gate 462 and thus an indication of the voltage transient event. When a voltage transient is detected, multiplexer 430 may select the previous sample (previous "valid sample") for coupling to delay device 426 as an output for circuit 416. When no voltage transient is detected, multiplexer 430 may select the current sample for coupling to delay device 426 as an output of circuit 416.

Having described preferred embodiments, which serve to illustrate various concepts, structures and techniques, which are the subject of this patent, it will now become apparent to those of ordinary skill in the art that other embodiments incorporating these concepts, structures and techniques may be used. It should also be appreciated, for example, that the structures described herein may also include underlying integrated circuits (IC) (not illustrated in FIGS. 2-2D) disposed on the substrate. For example, the structures may include analog and/or digital circuits disposed on the magnetic sensing layer. Accordingly, it is submitted that that scope of the patent should not be limited to the described embodiments but rather should be limited only by the spirit and scope of the following claims.

What is claimed:

1. A magnetic field sensor integrated circuit, comprising:
a substrate having a first surface and a second opposing surface;
at least one magnetic field sensing element supported by the first surface of the substrate;
an electromagnetic shield layer disposed on a shielded region of the first surface of the substrate adjacent to an unshielded region of the first surface of the substrate;
an electrode disposed in the unshielded region of the first surface of the substrate and configured to permit detection of a voltage transient; and
a threshold detection circuit configured to detect whether a rate of change of a voltage across a capacitance between a current conductor portion of the magnetic field sensor integrated circuit and the electrode is greater than a predetermined level.

2. The magnetic field sensor integrated circuit of claim 1, further comprising a bond pad coupled to the electrode.

3. The magnetic field sensor integrated circuit of claim 1, wherein the electromagnetic shield layer has at least one feature configured to reduce an eddy current in the electromagnetic shield layer.

4. The magnetic field sensor integrated circuit of claim 1, wherein the at least one magnetic field sensing element comprises a Hall Effect element.

5. The magnetic field sensor integrated circuit of claim 1, wherein the at least one magnetic field sensing element comprises a magnetoresistance element.

6. The magnetic field sensor integrated circuit of claim 5, wherein the magnetoresistance element comprises one or more of a giant magnetoresistance (GMR) element, a linear spin-valve, a magnetic tunnel junction (MTJ) element, a tunneling magnetoresistance (TMR) element, or an anisotropic magnetoresistance (AMR) element.

7. The magnetic field sensor integrated circuit of claim 1, wherein the threshold detection circuit comprises at least one comparator having a first input coupled to the electrode, a second input responsive to a reference voltage, and an output at which a comparator output signal is provided at a first level when the rate of change of the voltage across the capacitance is greater than the predetermined level and at a second level when the rate of change of the voltage across the capacitance is less than the predetermined level.

8. The magnetic field sensor integrated circuit of claim 7, wherein the comparator output signal is provided as an output of the magnetic field sensor integrated circuit.

9. A current sensor comprising:
a lead frame comprising a plurality of leads;
a current conductor portion comprising at least two of the plurality of leads;
a substrate having first and second opposing surfaces, the first surface proximate to the current conductor portion and the second surface distal from the current conductor portion;
one or more magnetic field sensing elements supported by the first surface of the substrate;
at least one electrode supported by the first surface of the substrate; and
a threshold detection circuit configured to detect whether a rate of change of a voltage across a capacitance between the current conductor portion and the electrode is greater than a predetermined level.

10. The current sensor of claim 9, further comprising an electromagnetic shield disposed on a shielded region of the first surface of the substrate adjacent to an unshielded region of the first surface of the substrate.

11. The current sensor of claim 10, wherein the one or more magnetic field sensing elements are disposed in the shielded region of the first surface of the substrate and the at least one electrode is disposed in the unshielded region of the first surface of the substrate.

12. The current sensor of claim 10, wherein the electromagnetic shield has at least one feature configured to reduce an eddy current in the electromagnetic shield.

13. The current sensor of claim 9, wherein the at least one or more magnetic field sensing element comprises a Hall Effect element.

14. The current sensor of claim 9, wherein the at least one or more magnetic field sensing element comprises a magnetoresistance element.

15. The current sensor of claim 14, wherein the magnetoresistance element comprises one or more of a giant magnetoresistance (GMR) element, a linear spin-valve, a magnetic tunnel junction (MTJ) element, a tunneling magnetoresistance (TMR) element, or an anisotropic magnetoresistance (AMR) element.

16. The current sensor of claim 9, wherein the threshold detection circuit comprises at least one comparator having a first input coupled to the at least one electrode, a second input responsive to a reference voltage, and an output at which a comparator output signal is provided at a first level when the rate of change of the voltage across the capacitance is greater than the predetermined level and at a second level when the rate of change of the voltage across the capacitance is less than the predetermined level.

17. The current sensor of claim 16, wherein the comparator output signal is provided as an output of the current sensor.

18. A method for sensing a voltage transient in a magnetic field sensor integrated circuit, comprising:
providing a substrate having a surface supporting a magnetic field sensing element configured to generate a magnetic field signal in response to a magnetic field and supporting an electrode;
generating a sensor output signal associated with the magnetic field signal;
shielding only a portion of the surface of the substrate to expose the electrode;
detecting a rate of change of a voltage across a capacitance between a current conductor adjacent to the surface of the substrate and the electrode; and
determining whether the detected rate of change of the voltage is greater than a predetermined level and generating a comparison signal indicative of the determination.

19. The method of claim 18, wherein the magnetic field corresponds to a magnetic field generated by the current conductor.

20. The method of claim 18, wherein the magnetic field signal is provided as the sensor output signal of the magnetic field sensor integrated circuit.

21. The method of claim 18, further comprising storing a previous sample of the magnetic field signal.

22. The method of claim 21, wherein generating the comparison signal comprises providing the comparison signal at a first level when the rate of change of the voltage across the capacitance is greater than the predetermined level or at a second, opposite level when the rate of change of the voltage across the capacitance is less than the predetermined level.

23. The method of claim 22, wherein the previous sample of the magnetic field signal is provided as the sensor output signal of the magnetic field sensor when the comparison signal is at the first level.

24. The method of claim 22, further comprising updating the previous sample of the magnetic field signal when the comparison signal is at the second level and holding the previous sample of the magnetic field signal when the comparison signal is at the first level.

25. The method of claim 21, wherein storing a previous sample of the magnetic field signal comprises storing an odd number of at least three previous samples of the magnetic field signal and further comprising computing a median value of the stored previous samples of the magnetic field signal.

26. The method of claim 25, wherein the median value of the stored previous samples of the magnetic field signal is provided as the sensor output signal when the comparison signal is at the first level.

27. The method of claim 21, further comprising:
storing a difference between a current sample of the magnetic field signal and the previous sample of the magnetic field signal;
comparing the difference to a threshold value to generate a difference signal; and
providing the current sample of the magnetic field signal as the sensor output signal when the difference signal is at a first level and providing the previous sample of the magnetic field signal as the sensor output signal of the magnetic field sensor when the difference signal is at a second, opposite level.

28. The method of claim 18, further comprising detecting a rate of change of a second voltage across a second capacitance between the current conductor and a lead of a lead frame electrically coupled to the substrate.

29. A method for sensing a voltage transient in a magnetic field sensor integrated circuit, comprising:
providing a substrate having a surface supporting a magnetic field sensing element configured to generate a magnetic field signal;
generating a sensor output signal associated with the magnetic field signal;
detecting a rate of change of a voltage across a capacitance between a current conductor adjacent to the surface of the substrate and at least one lead of a lead frame electrically coupled to the substrate; and
determining whether the detected rate of change of the voltage is greater than a predetermined level and generating a comparison signal indicative of the determination.

30. The method of claim 29, further comprising shielding only a portion of the surface of the substrate.

31. The method of claim 29, wherein the magnetic field signal is provided as the sensor output signal of the magnetic field sensor integrated circuit.

32. The method of claim 29, further comprising storing a previous sample of the magnetic field signal.

33. The method of claim 32, wherein generating the comparison signal comprises providing the comparison signal at a first level when the rate of change of the voltage across the capacitance is greater than the predetermined level or at a second, opposite level when the rate of change of the voltage across the capacitance is less than the predetermined level.

34. The method of claim 33, wherein the previous sample of the magnetic field signal is provided as the sensor output signal when the comparison signal is at the first level.

35. The method of claim 33, further comprising updating the previous sample of the magnetic field signal when the comparison signal is at the second level and holding the previous sample of the magnetic field signal when the comparison signal is at the first level.

36. The method of claim 32, wherein storing a previous sample of the magnetic field signal comprises storing an odd number of at least three previous samples of the magnetic field signal and further comprising computing a median value of the stored previous samples of the magnetic field signal.

37. The method of claim 36, wherein the median value of the stored previous samples of the magnetic field signal is provided as the sensor output signal when the comparison signal is at the first level.

38. The method of claim 32, further comprising:
storing a difference between a current sample of the magnetic field signal and the previous sample of the magnetic field signal;

comparing the difference to a threshold value to generate a difference signal; and providing the current sample of the magnetic field signal as the sensor output signal when the difference signal is at a first level and providing the previous sample of the magnetic field signal as the sensor output signal of the magnetic field sensor when the difference signal is at a second, opposite level.

\* \* \* \* \*

UNITED STATES PATENT AND TRADEMARK OFFICE
CERTIFICATE OF CORRECTION

PATENT NO. : 10,156,614 B2
APPLICATION NO. : 15/363208
DATED : December 18, 2018
INVENTOR(S) : Alexander Latham et al.

It is certified that error appears in the above-identified patent and that said Letters Patent is hereby corrected as shown below:

In the Specification

Column 10, Lines 54-55 delete "260fThe output of circuitry 223" and replace with --260f. The output of circuitry 223--.

Signed and Sealed this
Nineteenth Day of February, 2019

Andrei Iancu
*Director of the United States Patent and Trademark Office*